(12) United States Patent
Tucker et al.

(10) Patent No.: US 7,808,159 B2
(45) Date of Patent: Oct. 5, 2010

(54) MAGNETOSTRICTIVE / PIEZO REMOTE POWER GENERATION, BATTERY AND METHOD

(75) Inventors: Randall L. Tucker, Findlay, OH (US); Gary T. Carroll, Louisville, CO (US)

(73) Assignee: Cooper Tire & Rubber Company, Findlay, OH (US)

( * ) Notice: Subject to any disclaimer, the term of this patent is extended or adjusted under 35 U.S.C. 154(b) by 0 days.

(21) Appl. No.: 12/380,478

(22) Filed: Feb. 27, 2009

(65) Prior Publication Data

US 2009/0167115 A1 Jul. 2, 2009

Related U.S. Application Data

(62) Division of application No. 11/820,840, filed on Jun. 21, 2007, now Pat. No. 7,521,842.

(60) Provisional application No. 60/816,010, filed on Jun. 22, 2006, provisional application No. 60/831,619, filed on Jul. 18, 2006.

(51) Int. Cl.
*H01L 41/00* (2006.01)
*H01L 41/09* (2006.01)

(52) U.S. Cl. .................. 310/339; 310/26; 310/311; 310/319

(58) Field of Classification Search .......... 310/26, 310/311, 317, 319, 339
See application file for complete search history.

(56) References Cited

U.S. PATENT DOCUMENTS

| | | | |
|---|---|---|---|
| 3,407,384 A * | 10/1968 | Wiley | ............ 367/157 |
| 3,815,651 A | 6/1974 | Neal | |
| 3,986,916 A | 10/1976 | Marangoni | |
| 3,994,653 A | 11/1976 | Marangoni | |
| 4,036,667 A | 7/1977 | Simon | |
| 4,067,235 A | 1/1978 | Markland et al. | |
| 4,074,227 A | 2/1978 | Kalmus | |
| 4,160,234 A | 7/1979 | Karbo et al. | |
| 4,695,823 A | 9/1987 | Vernon | |
| 4,862,486 A | 8/1989 | Wing et al. | |
| 4,911,217 A | 3/1990 | Dunn et al. | |

(Continued)

FOREIGN PATENT DOCUMENTS

GB 1339103 11/1973

(Continued)

OTHER PUBLICATIONS

Shuxiang Dong, Junyi Zhai, Naigang Wang, Feiming Bai, Jie Fang Li and D. Viehland; Fe-Ga/Pb($Mg_{1/3}Nb_{2/3}$)$O_3$-$PbTiO_3$, magnetoelectric laminate composites; 2005 American Institute of Physics; Nov. 28, 2005.

(Continued)

*Primary Examiner*—Thomas M Dougherty
(74) *Attorney, Agent, or Firm*—Emch, Schaffer, Schaub & Porcello Co., L.P.A.

(57) ABSTRACT

A power generation device generates power by subjecting a composite of magnetostrictive material and piezo material to a magnetic field. The composite of magnetostrictive material and piezo material may be incorporated in a battery or other storage device.

16 Claims, 6 Drawing Sheets

U.S. PATENT DOCUMENTS

| | | | |
|---|---|---|---|
| 5,011,379 A | 4/1991 | Hashimoto | |
| 5,083,457 A | 1/1992 | Schultz | |
| 5,218,861 A | 6/1993 | Brown et al. | |
| 5,319,354 A | 6/1994 | Myatt | |
| 5,346,663 A | 9/1994 | Sigenthaler | |
| 5,348,067 A | 9/1994 | Myatt | |
| 5,472,372 A | 12/1995 | Marangoni | |
| 5,483,827 A | 1/1996 | Kulka et al. | |
| 5,500,065 A | 3/1996 | Koch et al. | |
| 5,505,080 A | 4/1996 | McGhee | |
| 5,540,092 A | 7/1996 | Handfield et al. | |
| 5,562,787 A | 10/1996 | Koch et al. | |
| 5,573,610 A | 11/1996 | Koch et al. | |
| 5,573,611 A | 11/1996 | Koch et al. | |
| 5,585,554 A | 12/1996 | Handfield et al. | |
| 5,675,252 A * | 10/1997 | Podney | 324/244 |
| 5,694,111 A | 12/1997 | Huang | |
| 5,701,043 A | 12/1997 | Razzaghi | |
| 5,731,516 A | 3/1998 | Handfield et al. | |
| 5,731,750 A | 3/1998 | Tatomir et al. | |
| 5,731,751 A | 3/1998 | Vangala | |
| 5,731,754 A | 3/1998 | Lee, Jr. et al. | |
| 5,741,966 A | 4/1998 | Handfield et al. | |
| 5,781,104 A | 7/1998 | Huang | |
| 5,798,689 A | 8/1998 | Huang | |
| 5,825,283 A | 10/1998 | Camhi | |
| 5,825,286 A | 10/1998 | Coulthard | |
| 5,835,977 A | 11/1998 | Kamentser et al. | |
| 5,872,320 A | 2/1999 | Kamentser et al. | |
| 5,883,569 A | 3/1999 | Kolefas | |
| 5,969,608 A | 10/1999 | Sojdehei et al. | |
| 5,977,870 A | 11/1999 | Rensel et al. | |
| 6,028,525 A | 2/2000 | Shukla et al. | |
| 6,087,930 A | 7/2000 | Kulka et al. | |
| 6,147,659 A | 11/2000 | Takahashi et al. | |
| 6,204,765 B1 | 3/2001 | Brady et al. | |
| 6,208,244 B1 | 3/2001 | Wilson et al. | |
| 6,237,403 B1 | 5/2001 | Oldenettel et al. | |
| 6,257,289 B1 | 7/2001 | Tomita et al. | |
| 6,304,176 B1 | 10/2001 | Discenzo | |
| 6,437,558 B2 | 8/2002 | Li et al. | |
| 6,439,063 B1 | 8/2002 | Schnackenberg | |
| 6,441,731 B1 | 8/2002 | Hess | |
| 6,580,363 B1 | 6/2003 | Wilson | |
| 6,581,449 B1 | 6/2003 | Brown et al. | |
| 6,687,293 B1 | 2/2004 | Loyer et al. | |
| 6,693,541 B2 | 2/2004 | Egbert | |
| 6,700,567 B1 | 3/2004 | Jaeger et al. | |
| 6,700,931 B1 | 3/2004 | Lee et al. | |
| 6,705,365 B1 | 3/2004 | Wilson | |
| 6,725,713 B2 | 4/2004 | Adamson et al. | |
| 6,737,965 B2 | 5/2004 | Okubo | |
| 6,771,170 B2 | 8/2004 | Papallo, Jr. et al. | |
| 6,788,192 B2 | 9/2004 | Shimura | |
| 6,791,457 B2 | 9/2004 | Shimura | |
| 6,807,853 B2 | 10/2004 | Adamson et al. | |
| 6,809,515 B1 | 10/2004 | Li et al. | |
| 6,809,516 B1 | 10/2004 | Li et al. | |
| 6,825,758 B1 | 11/2004 | Laitsaari | |
| 6,843,113 B2 | 1/2005 | Lin | |
| 6,856,245 B2 | 2/2005 | Smith et al. | |
| 6,899,153 B1 | 5/2005 | Pollack et al. | |
| 6,950,009 B1 | 9/2005 | Nysen | |
| 6,984,902 B1 * | 1/2006 | Huang et al. | 310/26 |
| 7,075,437 B2 | 7/2006 | Bridgelall et al. | |
| 7,132,944 B1 | 11/2006 | Kron et al. | |
| 7,268,687 B2 | 9/2007 | Egbert et al. | |
| 7,298,343 B2 | 11/2007 | Forster et al. | |
| 7,521,842 B2 * | 4/2009 | Tucker et al. | 310/339 |
| 2002/0050744 A1 | 5/2002 | Bernstein et al. | |
| 2004/0191346 A1 | 9/2004 | Marangoni et al. | |
| 2006/0152212 A1 | 7/2006 | Beranger et al. | |
| 2006/0192628 A1 | 8/2006 | Schulman et al. | |
| 2006/0255663 A1 | 11/2006 | Vlad | |
| 2007/0035383 A1 | 2/2007 | Roemerman et al. | |
| 2007/0194945 A1 | 8/2007 | Atkinson | |
| 2008/0129147 A1 | 6/2008 | Thiesen et al. | |

FOREIGN PATENT DOCUMENTS

| | | |
|---|---|---|
| WO | WO 0191200 | 11/2001 |
| WO | WO 2005/022726 A1 | 3/2005 |
| WO | WO/2009/066100 * | 5/2009 |

OTHER PUBLICATIONS

MicroIDTM 13.56 MHz RFID System Design Guide; Microchip; 1999 Microchip Technology, Inc.; Jul. 1999/DS21299C.

Atmel; 13.56 MHz, 2048-bit RFID EEPROM; AT88RF020; Feb. 2006.

International Search Report; Mailed Nov. 26, 2008.

International Search Report; Mailed Jul. 11, 2008.

* cited by examiner

Prior Art

MAGNETOSTRICTIVE / PIEZO REMOTE POWER GENERATION, BATTERY AND METHOD

CROSS REFERENCE TO RELATED APPLICATION

The present application is based upon and claims the benefit of U.S. Provisional Application Nos. 60/816,010 filed Jun. 22, 2006, and 60/831,619 filed Jul. 18, 2006, and is a divisional of U.S. application Ser. No. 11/820,840; filed Jun. 21, 2007 now U.S. Pat. No. 7,521,842.

BACKGROUND OF THE INVENTION

In the manufacture and use of RFID (Radio Frequency Identification) the technology is divided into two major groups; Passive Tags that gather their power from close coupling to a reader thus enabling them to transmit or reflect information back to the reader. The second group is Active Tags which have their own power storage capability like a battery, capacitor or other devices. The tag is queried with a RF signal generated by the reader requesting the tag to transmit the data, which is received by the reader. This Active tag has a limited life due to the storage device's limited shelf life. The magnetostrictive/piezo device of the present invention provides power to operate an attached electrical device or to charge an electrical storage device that could be used by a multitude of sensors, receivers, transmitter or other electrical or electronic device. The new type of RFID using this power generating technology is hereinafter referred to as Network Powered Tag or NPRFID.

SUMMARY OF THE INVENTION

The present invention relates to a power generating device which is controlled from a natural or man-made pulsed or constant remotely operated magnetic or electromagnetic field, to a battery charged thereby and to a method for forming said battery. Magnetically affecting the magnetostrictive or similar material, causes a stretching, bending or displacement of a power producing crystal or material such as piezo which produces power each time a pulse of magnetism is sensed. The new power generating device produces power from a PME (Passive Magnetostrictive Electro-Active) device or similar devices. A passive magnetic field sensor made of layers of Terfenol-D $\{Fe2(Dy0.7Tb0.3)\}$ magnetostrictive material and ceramic PZT-5 will act as a generator to power electrical and electronic devices when in range of the querying transceiver magnetic field of (0.3 Oersted or larger). The magnetostrictive material or other material stretches, flexes or is physically distorted when in the presence of a magnetic field or pulsed magnetic field displaces the piezo type device attached thereto thereby, generating power for any electric or electronic device.

Under a preferred embodiment, when the power is generated, it will be stored in a bank of ferroelectric capacitors, capacitors or a rechargeable battery type device. The battery could be a rolled-up sheet of up to a few thousand of ferroelectric capacitors, all hooked together in parallel. Building ferroelectric capacitors larger than a certain size has not heretofore been successful. Therefore, in order to create a large ferroelectric capacitor, large numbers of smaller capacitors are built and wired in parallel to equal one large capacitor. The process is similar to the manufacture of integrated circuits where layers of material are deposited on top of other material and then etch away that material that is not needed. By doing this, it is possible to make large capacitors on a sheet of polyester such as Mylar® or polyimide such as Kapton® which is then rolled up to make a package that can fit easily into a cylinder as used in normal battery packaging.

The PME power generator/battery will generate power with each pulse of a magnetic or electromagnetic field. Pulsing of the magnetic source will allow the device to charge up a battery or capacitor to a usable level of voltage or current. In order to obtain optimum power, the magnetic field should be generated at a frequency that matches the natural frequency of the magnetostrictive/piezo composite. Power close to optimum power can be obtained if the magnetic field is generated at a frequency in the range of 90% to 110% of the natural resonant frequency of such composite. Additionally, the new magnetostrictive/piezo device providing power to a battery, capacitor or other storage device could be used in conjunction with a voltage regulator to provide a specific electrical voltage. The device could also function without the use of a regulator in some applications. This power generated would be encased in a typical or non-typical battery enclosure that could be used by all devices that utilize AAA, AA, C, D or other common battery forms. This new power generating battery would be called a NPB (Network Powered Battery). The battery could be powered by single or multiple magnetic generating devices. Additionally, a single magnetic generating device could power multiple NPBs. This new device could be configured to supply power to any number of battery powered devices and could also power and query a RFID tag at long distances.

The magnetic pulsed field could also be coded to provide instructions to the receiving device to turn-on, turn-off, or other specific task or operation such as store new data in memory, erase memory or go to sleep.

One preferred embodiment of the present invention can increase the capability over current battery technology by maintaining an ongoing charge to power the utilizing equipment, thereby providing a potentially infinite shelf life. This will have significant advantages in reliability of the utilizing equipment. The present invention could also provide a power source for medical, biomedical, night vision, GPS, radios, sensors, actuators and intelligence gathering technologies. The ability to transmit data to the battery can provide additional benefits such as power conservation, mode changes, data refresh and others.

Magnetostrictive Materials were discovered in the 1840s by James Prescott Joule, when he noticed that iron changed length in response to changes in magnetism and named the phenomenon the Joule Effect.

How It Works:

Magnetostrictive materials expand when exposed to a magnetic field, exhibiting the Joule Effect or Magnetostriction. This occurs because magnetic domains in the material align with the magnetic field. Similarly, when the material is strained (stretched or compressed), its magnetic energy changes. This phenomenon is called magnetomechanical effect or Villari Effect.

Some Examples of Magnetostrictive Materials:
cobalt
iron
nickel
ferrite
terbium Alloys (Terfenol-D)
Metglass
Galfenol (Gallium and Iron)

Since magnetostriction involves a bi-directional energy exchange between magnetic and elastic states, magnetostrictive materials when put together with a piezo material, provide a mechanism to produce an AC voltage from an alternating electromagnetic field.

DETAILED DESCRIPTION OF THE INVENTION

Figure 1:
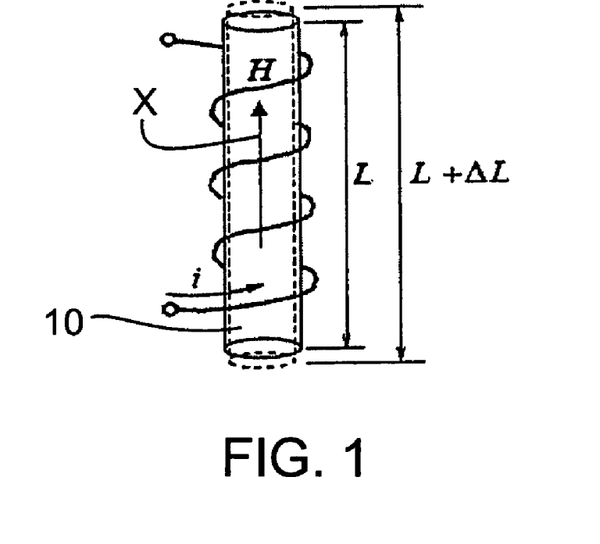
FIG. 1 is a schematic view showing the basic concept of magnetostrictive expansion.

FIG. 1 illustrates the Joule magnetostriction ΔL/L of a cylindrical sample 10, resulting from a magnetic field (H) being applied along the longitudinal axis X. The cylindrical sample 10 of magnetostrictive material is caused to stretch from a length L prior to application of a magnetic field to a length L+ΔL during application of a magnetic field.

Figure 2:
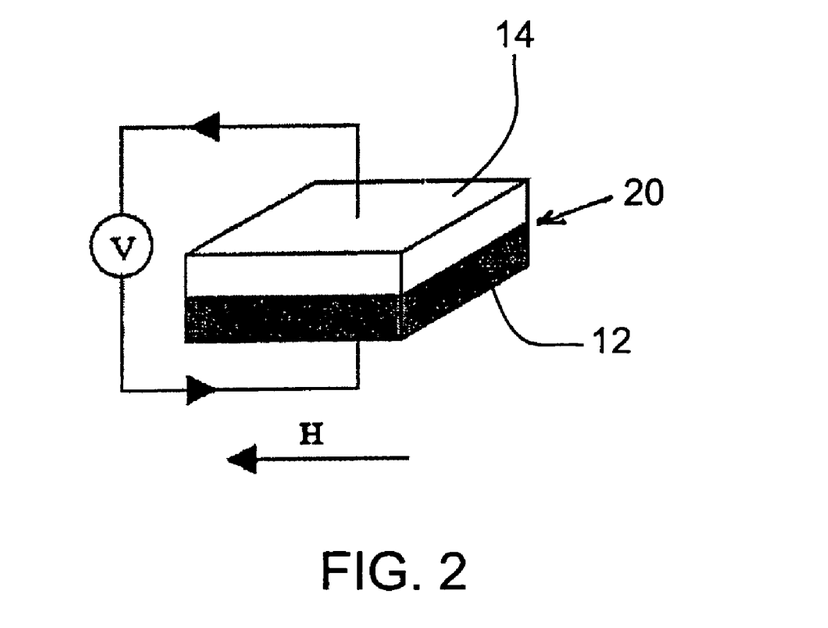
FIG. 2 is a perspective view of joined materials forming a composite of the present invention.

FIG. 2 illustrates a layer of magnetostrictive material 12 and a layer of piezoelectric material 14 bonded together forming a composite 20 of the magnetostrictive material and the piezo material. The composite, which could have a variety of configurations, is placed in a magnetic field H. When the magnetic field H is applied to the composite 20, the magnetostrictive material 12 stretches and thereby places a strain on the piezoelectric material 14 thus inducing a proportional voltage in the piezoelectric material 14. Depending on the configuration of the composite 20, the application of the magnetic field could cause the magnetostrictive material 12 to stretch, bend or be otherwise distorted.

Information regarding magnetoelectric laminate composites and magnetostrictive alloys may be found in Applied Physics Letter No. 87-222504 dated 28 Nov. 2005 which is incorporated herein by reference.

Figure 3:
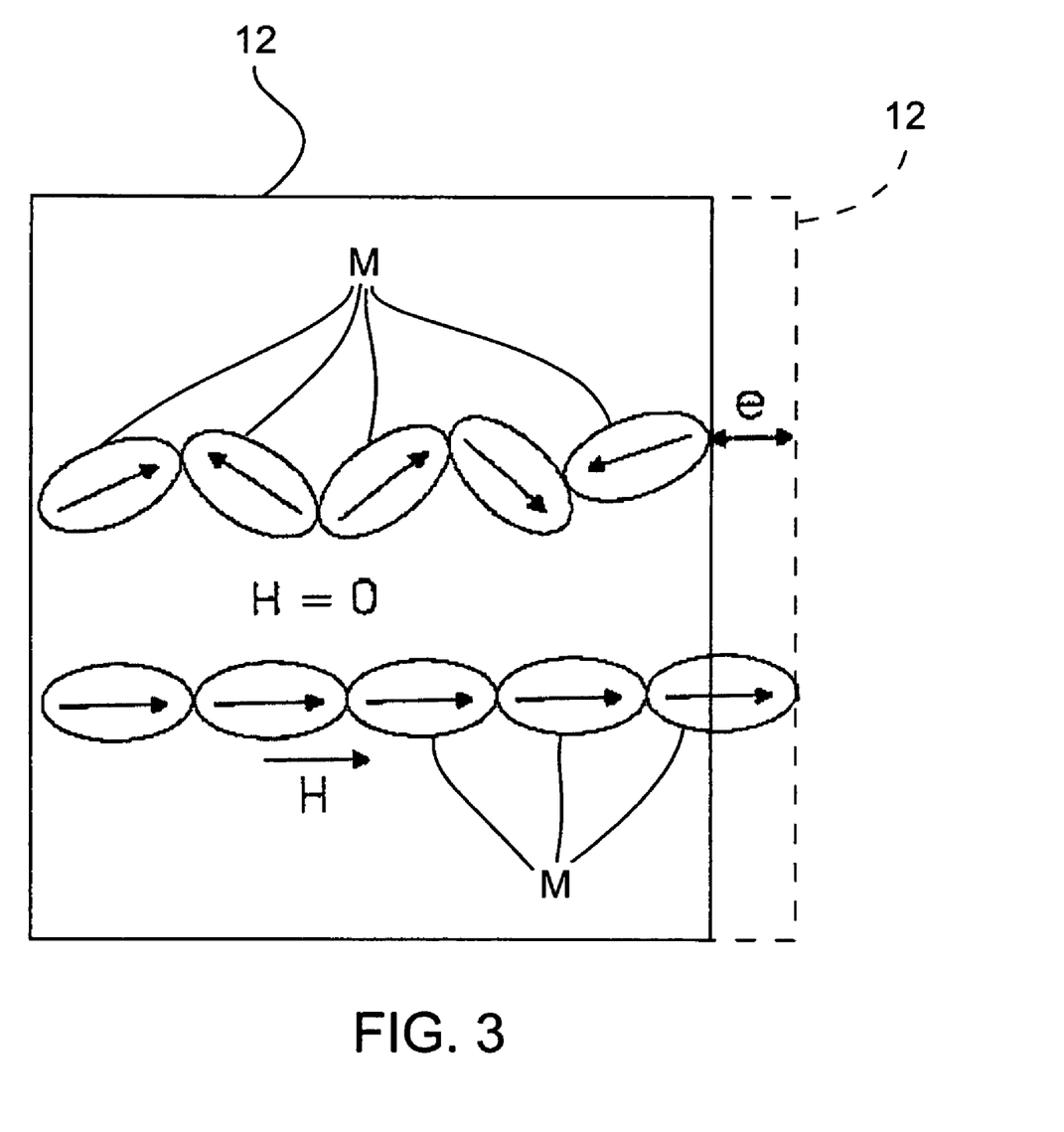
FIG. 3 is a schematic view showing the mechanism of magnetostriction.

Referring to FIG. 3, there is shown schematically a representation comparing (1) in the upper portion of FIG. 3, molecules M of the magnetostrictive material 12 positioned randomly when not subjected to a magnetic field H and (2), in the lower portion of FIG. 3, alignment of the molecules M when the magnetostrictive material 12 is subjected to a magnetic field H. As can be seen in FIG. 3, the length of the magnetostrictive material 12 increases as the molecules M align with the application of the magnetic field (H). The increase in length is designated by the letter e.

The mechanism of magnetostriction at an atomic level is relatively complex subject matter but on a macroscopic level may be segregated into two distinct processes. The first process is dominated by the migration of domain walls within the material in response to external magnetic fields. Second, is the rotation of the domains. These two mechanisms allow the material to change the domain orientation which in turn causes a dimensional change. Since the deformation is isochoric, there is an opposite dimensional change in the orthogonal direction. Although there may be many mechanisms to the reorientation of the domains, the basic idea, represented in FIG. 3, remains that the rotation and movement of magnetic domains causes a physical length change in the material.

Figure 4:
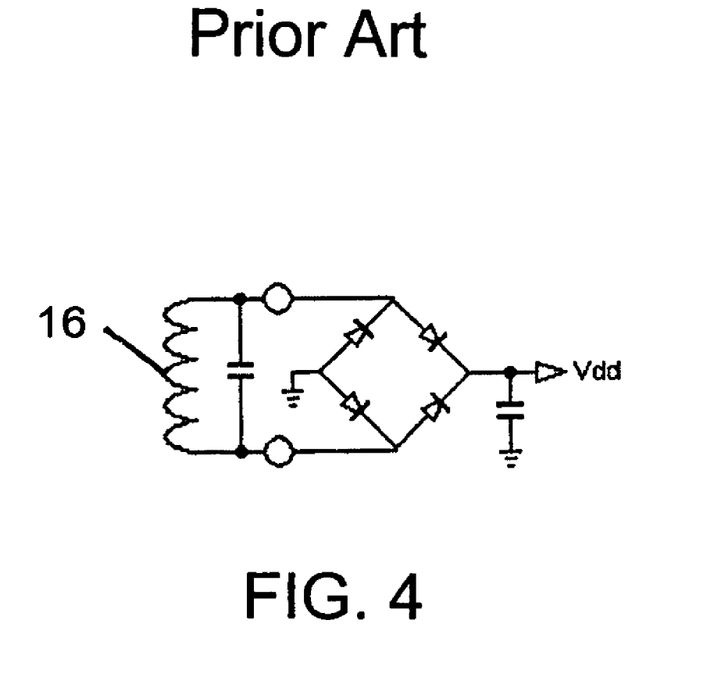
FIG. 4 is a wiring diagram showing prior art use of a coil for generating power.

FIG. 4 is a wiring diagram showing the prior art use of a coil 16 for generating electricity. A typical prior art RFID device uses a coil-capacitor 16 to capture the electromagnetic field to power up the RFID device. This technique works well for ranges up to a meter. The electromagnetic field (H field) drops off at an exponential rate as the distance between the RFID device and the power source increases. Thus, the sensitivity of the coil-capacitor 16 cannot capture enough energy from a power source location beyond about one meter from the prior art RFID device and its coil capacitor 16.

Figure 5:
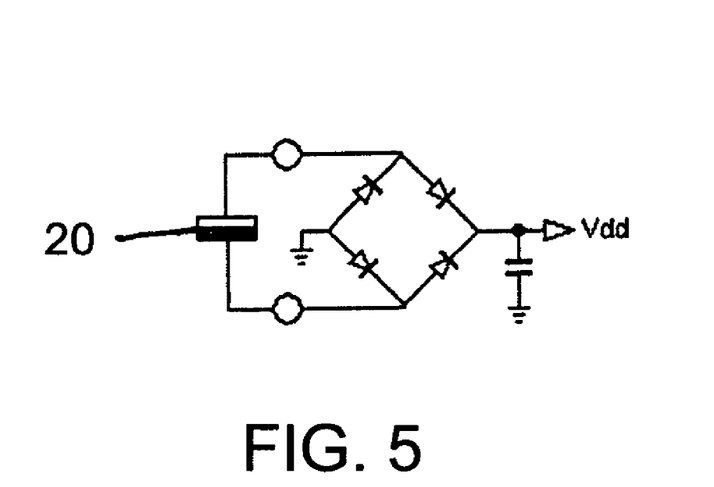
FIG. 5 is a wiring diagram showing generation of power by the magnetostricitve-piezo composite.

FIG. 5 is a wiring diagram showing short-medium-long range powering by a magnetostrictive-piezo composite 20 as set forth in the present invention.

The present invention takes advantage of a highly efficient mechanism that creates electrical energy from a weak magnetic field. Due to the fact that the composite 20 is much more efficient than a coil capacitor, the composite 20 will operate at a much lower magnetic field thereby a longer range. Also, as the device that contains composite 20 is moved through the earth's magnetic field, a voltage will be generated. This will allow device to be recharged by simply moving it.

A magnetostrictive-piezo device utilizing the composite 20 in a size of approximately one cm square can produce one volt per Oersted of magnetic field strength. (The earth's magnetic field is approximately one half Oersted.)

Figure 6:
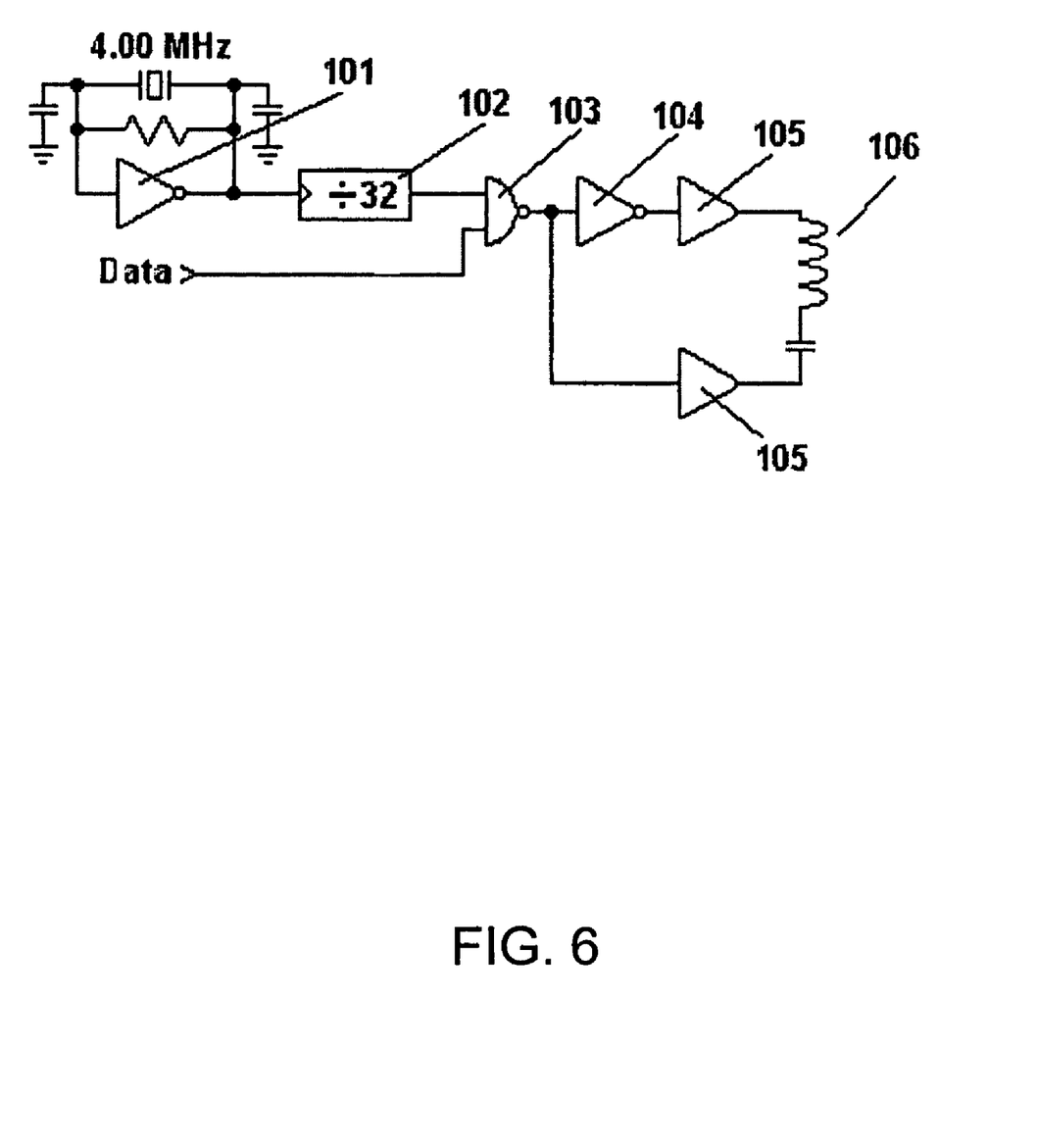
FIG. 6 is a diagram of a circuit that creates the electromagnetic field that can be modulated with commands and data.

Referring to FIG. 6 there is shown a circuit that creates the electromagnetic field that can be modulated with commands and data. An oscillator 101 runs at a frequency 4.00 MHz. The oscillator 101 can also be the oscillator for the microprocessor (not shown). In most microprocessor designs, a crystal is used to clock the microprocessor. The crystal used for the microprocessor can be shared for the coil drive 105 hereinafter described. The output of the oscillator 101 drives a counter/divider 102 that receives the 4.00 MHz signal and divides it by 32. The counter/divider 102 creates a 125 kHz square wave signal. If the microprocessor crystal was 8 MHz, it would be necessary to divide the frequency by 64 in order to obtain the required 125 kHz signal. A nand gate 103 is provided that can turn on and off the 125 kHz signal depending on the level of the data input. If the data input is a one, the 125 kHz will pass through. If the data input is a zero, the 125 kHz signal will be blocked and no signal will pass through to the inverter 104. The inverter 104 creates two phases of the 125 kHz signal to drive a coil-capacitor 106 from both ends. Two drives 105 that are heavy current devices are provided. They can drive the coil-capacitor 106 from both ends. By driving the coil-capacitor 106 this way with the heavy current drivers 105, less voltage is required from the power supply. If the coil were driven from a single side, the result would be one-half of what can be obtained by driving the coil-capacitor 106 on both sides. The end result is an electromagnetic field emanating from the coil-capacitor 106 and radiating into the area around the coil capacitor 106.

Figure 7:
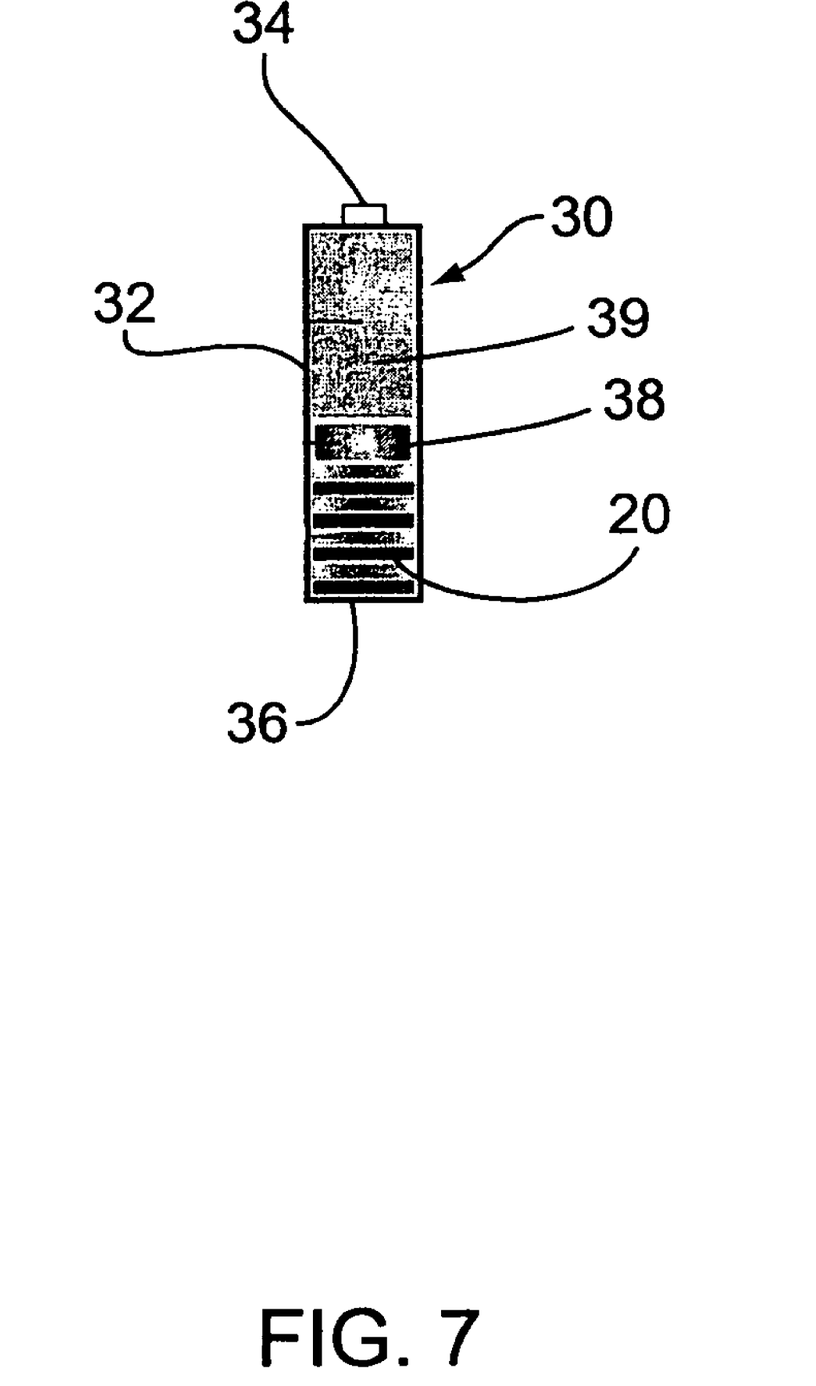
FIG. 7 is a sectional view of one form of battery according to the present invention.

Referring to FIG. 7, there is shown a battery 30 formed according to the present invention. Although the battery 30 shown in FIG. 7 has an exterior shape of a typical flashlight, penlight, battery, for example, with a size of A, AA, AAA, C or D, such battery 30 could have a wide variety of shapes and constructions. All battery types could be a candidate for replacement with this type of device.

As shown in FIG. 7, there is provided a battery 30 or other storage device such as a ferro-capacitor device having a substantially cylindrical casing 32 with a positive terminal 34 at one end and a negative terminal 36 at the other end. A voltage regulator 38 is shown positioned slightly below the midpoint of the casing 32. The voltage regulator 38 could be one such as that sold by National Semiconductor, San Jose, Calif., as its item No. LM78L05. The upper area 39 between the voltage regulator 38 and the positive terminal 34 has positioned therein a capacitor or a ferro capacitor. Capacitors and ferro capacitors are well known in the art of integrated circuits. Between the voltage regulator 38 and the negative terminal 36 are one or more magnetostrictive/piezo cells 20. If desired, the magnetostrictive/piezo cell composite could be positioned between the voltage regulator 38 and the positive terminal 34 and the PZT positioned between the voltage regulator 38 and the negative terminal. Additionally, for some applications where regulation of voltage is not a factor, the voltage regulator could be omitted.

Figure 8A:
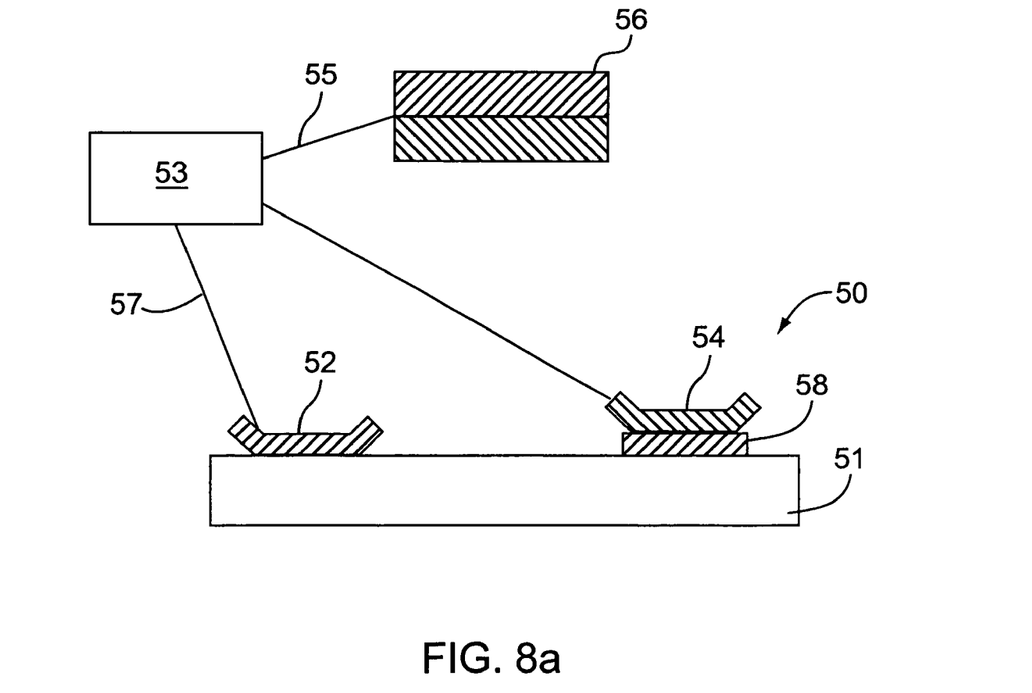
FIGS. 8a and 8b are views of another embodiment of battery (FIG. 8a) and an array of such batteries mounted on a substrate (FIG. 8b).
Figure 8B:
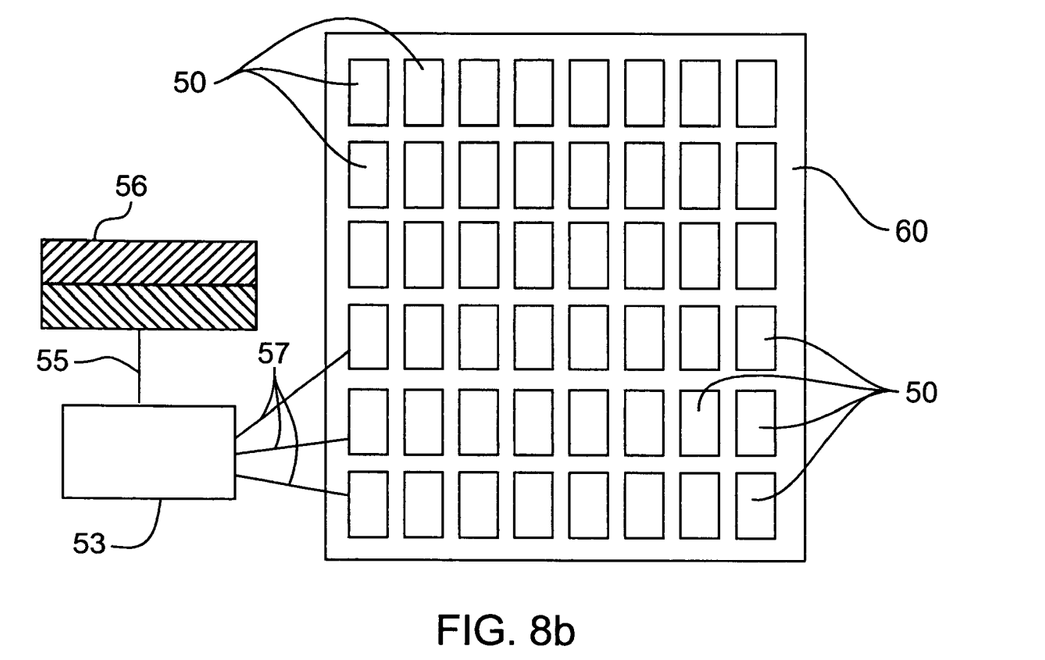

Referring to FIGS. 8a and 8b there is shown a modified embodiment of battery/capacitor 50 which is flat and could be quite small, for example, if rectangular in shape, as small as 100 millimeters long and 10 millimeters wide with a thickness in the range of ½ to 1 millimeters. A single modified battery/capacitor 50 is shown in FIG. 8a and includes a substrate of thin flexible plastic such as Mylar® or Kapton®, a first electrode 52, a second electrode 54 and a discrete unit of PZT 58. The first electrode 52 is mounted directly on the substrate 51. The discreet unit of PZT 58 is also positioned directly on the substrate 51 with the second electrode 54 being positioned on the discreet unit of PZT 58. A magnetostrictive/piezo cell 56 is spaced from the battery/capacitor 50 and is connected thereto through a voltage regulator 53 via wires 55 and 57.

Referring to FIG. 8b, there is shown a multitude of modified batteries/capacitors 50 mounted on a flat sheet or substrate 60 of Mylar® or Kapton®. Although FIG. 8b shows 48 batteries/capacitors 50 mounted on the substrate 60, there could be hundreds or even more than a thousand batteries/capacitors 50 mounted on the substrate 60. The batteries/capacitors 50 could have a voltage on the order of 1.5 volts and generate amperage of 1 milliamp each. Thus, assuming 100 batteries/capacitors 50 were mounted on the substrate 60 and wired in parallel, they could generate a current as high as 2 amps. A single magnetostrictive/piezo cell 56 can power many batteries/capacitors 50, possible as many as 10,000.

The substrate 60 of Mylar® or Kapton® should be thin enough so that the substrate 60 with the batteries 50 mounted thereon could be rolled into a cylindrical form for convenience of usage. A thickness of 0.5 to 1 millimeters for the substrate 60 would be suitable.

One type of passive magnetic magnetostrictive electroactive device is a vibration energy harvester sold by Ferro Solutions, Inc., Cambridge, Mass. which is believed to incorporate features described in U.S. Pat. No. 6,984,902. Other prior art includes U.S. Pat. No. 6,725,713 which discloses the use of piezoelectric materials for generating power from a rotating tire.

Features of the magnetostrictive/piezo device and its use include:

The device generates electrical power with the use of magnetic fields

The device uses magnetic or electromagnetic pulses to generate a pulse of electrical power. The magnetic source can be from a local or distant source.

Electrical power can be generated from the device by rotating the device in a magnetic field or within the earth's magnetic field. Power can also be generated by transmitting an electromagnetic field to the device at most frequencies but is most efficient at the resonant frequency of the device.

The electrical power voltage and current is proportional to the piezo or similar material.

When the piezo is flexed, distorted or displaced by any material, specifically a magnetostrictive material, the piezo material will produce a voltage.

The device's power can be used as a one time pulse or accumulated in a battery or capacitor to attain larger voltages or current.

The device could be utilized to power medical devices, sensors, transmitters and other small devices that require minimal or no maintenance or battery replacement.

The device can be used to power RFID devices using remote magnetic field generation equipment.

Data can be transmitted on the pulsed power sources carrier signal to the device to interrogate or direct the device to a response. This information could be EPC, SKU or other serial data.

The device generates electrical power with the use of magnetic fields and stores the power in a bank of ferroelectric capacitors or a rechargeable battery.

Electrical power can be generated from the device by rotating the device in a magnetic field or within the earth's magnetic field. Power can also be generated by transmitting an electromagnetic field to the device at most frequencies but is most efficient at the resonant frequency of the composite 20. A magnetic field outside such resonant frequency will activate the magnetostrictive material but not as efficiently as if it were at the natural resonant frequency of the composite or in the range of 90% to 110% of such resonant frequency. Sending the magnetic field at the resonant frequency of the composite will allow the transfer of energy at a factor of 10× or more as compared to a non-resonant frequency.

The electrical power voltage and current is proportional to the piezo or similar materials characteristics. As would be expected, a larger piece of piezo material will produce more energy than a smaller one.

When the piezo is flexed, distorted or displaced by any material, specifically a magnetostrictive material, the piezo material will produce a voltage.

The device's power can be accumulated in a battery or capacitor to attain larger voltages or current.

The battery being charged could be a rolled up sheet of up to thousands of ferroelectric capacitor all hooked together in parallel.

The above detailed description of the present invention is given for explanatory purposes. It will be apparent to those skilled in the art that numerous changes and modifications can be made without departing from the scope of the invention. Accordingly, the whole of the foregoing description is to be construed in an illustrative and not a limitative sense, the scope of the invention being defined solely by the appended claims.

The invention claimed is:

1. A battery comprising:
a) a composite of (i) a magnetostrictive material and (ii) a piezo material which generates electricity when subjected to a pulsed or continuous magnetic field;
b) a capacitor or ferro capacitor connected thereto;
c) a voltage regulator positioned between said composite and said capacitor or ferro capacitor; and
d) a flexible substrate supporting said composite, said voltage regulator and said capacitor or ferro capacitor.

2. A battery according to claim 1 wherein said piezo is lead zirconate titanate (PZT).

3. A battery according to claim 1 wherein said flexible substrate is formed from a material selected from the group consisting of polyester and polyimide.

4. A battery according to claim 1 wherein said composite has been subjected to a magnetic field having a frequency within the range of 90% to 110% of the natural resonant frequency of the composite.

5. A multi-unit battery comprising a plurality of batteries according to claim 1 wired in parallel and mounted on said flexible substrate.

6. A multi-unit battery according to claim 5 wherein said flexible substrate with said plurality of batteries mounted therein is rolled upon itself to form a cylindrical shape.

7. A multi-unit battery according to claim 6 wherein said cylindrical shape has a first end and a second end and further including a pair of electrodes, one on said first end and the other on said second end.

8. A multi-unit battery according to claim 5 further including electrodes attached to one or more of said capacitors or ferro capacitors.

9. A battery comprising:
(a) a composite of (i) a magnetostrictive material and (ii) a piezo material which generates electricity when subjected to a pulsed or continuous magnetic field;
(b) a capacitor or ferro capacitor connected thereto;
(c) a voltage regulator positioned between said composite and said capacitor or ferro capacitor; and
(d) a coil driver system for creating an electromagnetic field, said coil driver system including (i) an oscillator transmitting a signal at a first frequency to divider, said divider reducing the frequency of said signal and transmitting said reduced frequency signal to a nand gate, and (ii) an inverter for creating two phases of said reduced frequency signal received from said nand gate and transmitting said phrases, respectively, to first and second drivers, said first driver transmitting said reduced frequency signal to a first end of said capacitor or ferro capacitor and said second driver transmitting said reduced frequency signal to a second end of said capacitor or ferro capacitor.

10. A battery according to claim 9 wherein said piezo is lead zirconate titanate (PZT).

11. A battery according to claim 9 wherein said composite has been subjected to a magnetic field having a frequency within the range of 90% to 110% of the natural resonant frequency of the composite.

12. A multi-unit battery comprising a plurality of batteries mounted on a flexible substrate, each said battery including:
(a) a composite of (i) a magnetostrictive material and (ii) a piezo material which generates electricity when subjected to a pulsed or continuous magnetic field;
b) a capacitor or ferro capacitor connected thereto;
c) a voltage regulator positioned between said composite and said capacitor or ferro capacitor;
d) a flexible substrate supporting said composite, said voltage regulator and said capacitor or ferro capacitor; and
(e) a coil driver system for creating an electromagnetic field, said coil driver system including: (i) an oscillator transmitting a signal at a first frequency to a divider, said divider reducing the frequency of said signal and transmitting said reduced frequency signal to a nand gate, and (ii) an inverter for creating two phases of said reduced frequency signal received from said nand gate and transmitting said phases, respectively, to first and second drivers, said first driver transmitting said reduced frequency signal to a first end of said capacitor or ferro capacitor and said second driver transmitting said reduced frequency signal to a second end of said capacitor or ferro capacitor.

13. A multi-unit battery according to claim 12 wherein said flexible substrate is formed from a material selected from the group consisting of polyester and polyimide.

14. A multi-unit battery according to claim 12 wherein said plurality of batteries are wired in parallel and mounted on said flexible substrate.

15. A multi-unit battery according to claim 14 wherein said flexible substrate with said plurality of batteries mounted therein is rolled upon itself to form a cylindrical shape and having a first end and a second end and further including a pair of electrodes, one on said first end and the other on said second end.

16. A multi-unit battery according to claim 14 further including electrodes attached to one or more of said capacitors or ferro capacitors.

* * * * *